(12) United States Patent
Luo et al.

(10) Patent No.: US 11,486,055 B2
(45) Date of Patent: Nov. 1, 2022

(54) POLAR NANOREGIONS ENGINEERED RELAXOR-PBTIO$_3$ FERROELECTRIC CRYSTALS

(71) Applicants: TRS TECHNOLOGIES, INC., State College, PA (US); THE PENN STATE RESEARCH FOUNDATION, University Park, PA (US)

(72) Inventors: Jun Luo, State College, PA (US); Wesley S. Hackenberger, State College, PA (US); Fei Li, State College, PA (US); Shujun Zhang, State College, PA (US); Thomas R. Shrout, Pennsylvania Furnace, PA (US)

(73) Assignees: TRS TECHNOLOGIES, INC., State College, PA (US); THE PENN STATE RESEARCH FOUNDATION, University Park, PA (US)

( * ) Notice: Subject to any disclaimer, the term of this patent is extended or adjusted under 35 U.S.C. 154(b) by 921 days.

(21) Appl. No.: 16/119,666

(22) Filed: Aug. 31, 2018

(65) Prior Publication Data

US 2019/0071791 A1    Mar. 7, 2019

Related U.S. Application Data

(60) Provisional application No. 62/553,511, filed on Sep. 1, 2017.

(51) Int. Cl.
*C30B 29/32* (2006.01)
*H01L 41/18* (2006.01)
(Continued)

(52) U.S. Cl.
CPC .............. *C30B 29/32* (2013.01); *C30B 11/00* (2013.01); *C30B 29/30* (2013.01); *H01L 41/18* (2013.01);
(Continued)

(58) Field of Classification Search
CPC ......... C30B 29/32; C30B 11/00; C30B 29/30; H01L 41/18; H01L 41/1875
See application file for complete search history.

(56) References Cited

U.S. PATENT DOCUMENTS

| 6,117,355 A | 9/2000 | Yoshizawa et al. |
| 7,972,527 B2 * | 7/2011 | Luo .................. C30B 29/30 252/62.9 R |

(Continued)

FOREIGN PATENT DOCUMENTS

| EP | 1479796 A2 | 11/2004 |
| JP | H07105732 A | 4/1995 |

(Continued)

OTHER PUBLICATIONS

Zhong. Effect of rare earth additives on the microstructure and dielectric properties of 0.67Pb(Mg1/3Nb2/3)O3-0.33PbTiO3 ceramics. Materials Science and Engineering B 116 (2005) 140-145 (Year: 2004).*

(Continued)

*Primary Examiner* — Matthew E. Hoban
(74) *Attorney, Agent, or Firm* — McNees Wallace & Nurick LLC (57) ABSTRACT

A relaxor-PT based piezoelectric crystal is disclosed, comprising the general formula of $(Pb_{1-1.5x}M_x)\{[(M_I,M_{II})_{1-z}(M_{I'},M_{II'})_z]_{1-y}Ti_y\}O_3$, wherein: M is a rare earth cation; $M_I$ is selected from the group consisting of $Mg^{2+}$, $Zn^{2+}$, $Yb^{3+}$, $Sc^{3+}$, and $In^{3+}$; $M_{II}$ is $Nb^{5+}$; $M_{I'}$ is selected from the group consisting of $Mg^{2+}$, $Zn^{2+}$, $Yb^{3+}$, $Sc^{3+}$, $In^{3+}$, and $Zr^{4+}$; $M_{II'}$ is $Nb^{5+}$ or $Zr^{4+}$; $0<x\leq0.05$; $0.02<y<0.7$; and $0\leq z\leq 1$, provided that if either $M_{I'}$ or $M_{II'}$ is $Zr^{4+}$, both $M_{I'}$ and $M_{II'}$ are $Zr^{4+}$. A method for forming the relaxor-PT based piezoelectric crystal is disclosed, comprising pre-synthesizing precursor materials by calcining mixed oxides, mixing the precursor materials with single oxides and calcining to form a feeding (Continued)

material, and growing the relaxor-PT based piezoelectric crystal having the general formula of $(Pb_{1-1.5x}M_x)\{[(M_I, M_{II})_{1-z}(M_I,M_{II})_z]_{1-y}Ti_y\}O_3$ from the feeding material by a Bridgman method.

32 Claims, 6 Drawing Sheets

(51) Int. Cl.
    *H01L 41/41*           (2013.01)
    *C30B 11/00*          (2006.01)
    *C30B 29/30*          (2006.01)
    *H01L 41/187*         (2006.01)

(52) U.S. Cl.
    CPC .......... *H01L 41/1875* (2013.01); *H01L 41/41* (2013.01)

(56) References Cited

U.S. PATENT DOCUMENTS

| | | | |
|---|---|---|---|
| 8,894,765 B1* | 11/2014 | Hackenberger | C30B 29/32 117/9 |
| 2004/0206296 A1* | 10/2004 | Lee | C30B 11/00 117/2 |
| 2009/0194732 A1* | 8/2009 | Luo | C30B 29/22 117/73 |
| 2011/0311815 A1* | 12/2011 | Luo | C04B 35/499 428/401 |
| 2020/0131667 A1* | 4/2020 | Nakamura | H01L 41/1875 |

FOREIGN PATENT DOCUMENTS

| | | |
|---|---|---|
| JP | H07107596 A | 4/1995 |
| JP | 2000044336 A | 2/2000 |
| JP | 2014500614 A | 1/2014 |

OTHER PUBLICATIONS

Pramila. Investigations on the piezoelectric and structural properties of samarium-doped lead zirconate titanate ceramics. Materials Science and Engineering, B26 (1994) 25-28 (Year: 1994).*
Zhong. Effect of rare earth additives on the microstructure and dielectric properties of 0.67Pb(Mg1/3Nb2/3)O3-0.33PbTiO3ceramics. Materials Science and Engineering B 116 (2005) 140-145 (Year: 2005).*
Yasuda. Piezoelectric Properties of a High Curie Temperature Pb(In1/2Nb1/2)O3—PbTiO3 Binary. 2000 Jpn. J. Appl. Phys. 39 L66 (Year: 2000).*
Zhang. Fundamental mechanisms responsible for the temperature coefficient of resonant frequency in microwave dielectric ceramics. J. Am. Ceram. Soc. 2017; 1-9 (Year: 2017).*
Zhang, Shujun et al., "Relaxor-PT single crystals: observations and developments", IEEE Transactions on Ultrasonics, Ferroelectrics, and Frequency Control, 2010, vol. 57, No. 10, pp. 2138-2146.
Tian, Jian et al., "Crystal growth and property characterization for PIN-PMN-PT ternary piezoelectric crystals", Journal of Advanced Dielectrics, 2014, vol. 4, No. 1, Article No. 1350027, Internal pp. 1-5.
Garg, Ajai et al., "Effect of rare earth (Er, Gd, Eu, Nd and La) and bismuth additives on the mechanical and piezoelectric properties of lead zirconate titanate ceramics", Materials Science and Engineering: B, vol. 86, No. 2, pp. 134-143.
Zhong Ni et al., "Effect of rare earth additives on the microstructure and dielectric properties of 0.67Pb(Mg1/3Nb2/3) O3-0.33PbTiO3 ceramics," Materials Science and Engineering: B, vol. 116, No. 2, pp. 140-145.
Shujun Zhang, et al. Advantages and challenges of relaxor-PbTiO3 ferroelectric crystals for electroacoustic transducers—A review. Progress in Materials Science 68 (2015) 1-66; journal homepage: www.elsevier.com/locate/pmatsci, published online Oct. 17, 2014.
IEEE Standard on Piezoelectricity, ANS/IEEE Std 176-1987, copyright 1988 by the Institute of Electrical and Electronics Engineers, Inc.
Shujun Zhang, et al. Relaxor-PbTiO3 Single Crystals for Various Applications, IEEE Transactions on Ultrasonics, Ferroelectrics, and Frequency Control, vol. 60, No. 8, Aug. 2013, 1572-1580.
Shujun Zhang, et al. High performance ferroelectric relaxor-PbTiO3 single crystals: Status and perspective, Applied Physics Reviews, Journal of Applied Physics 111, 031301 (2012), published online Feb. 7, 2012.
Fei Li, et al. The origin of ultrahigh piezoelectricity in relaxor-ferroelectric solid solution crystals, Nature Communications, Accepted Nov. 3, 2016, Published Dec. 19, 2016, DOI: 10.1038/ncomms13807, www.nature.com/naturecommunications, 1-9.
Haosu Luo, et al. (1999) Growth and characterization of relaxor ferroelectric PMNT single crystals, Ferroelectrics, 231:1, 97-102, DOI: 10.1080/00150199908014518, published online Mar. 9, 2011.
Park et al. "Characteristics of Relaxor-Based Piezoelectric Single Crystals for Ultrasonic Transducers" IEEE Transactions on Ultrasonics, Ferroelectrics and Frequency Control, Sep. 1997, pp. 1140-1147, vol. 44, No. 5.
Zhang et al. "Adantages and challenges of relaxor-PbTiO3 ferroelectric crystals for electoacoustic transducers—A review" Progress in Materials Science, 2015, pp. 1-66, vol. 68, Elsevier Ltd.
Zhang et al. "High performance ferroelectric relaxor-PbTiO3 single crystals: Status and perspective" Journal of Applied Physics, 2012, vol. 111, pp. 031301 1-50, American Institute of Physics.
Trolier-McKinstry et al. "High-Performance Piezoelectric Crystals, Ceramics, and Films" Annual Review of Materials Research, 2018, vol. 48, pp. 191-217.
Zhang et al. "Face shear piezoelectric properties of relaxor-PbTiO3 single crystals" Applied Physics Letters, 2011, vol. 98, pp. 182903 1-3, American Institute of Physics.
Zhang et al. "Crystallographic dependence of loss in domain engineered relaxor-PT single crystals" Applied Physics Letters, 2009, vol. 94, pp. 162906 1-3, American Institute of Physics.
Park et al. "Ultrahigh strain and piezoelectric behavior in relaxor based ferroelectric single crystals" Journal of Applied Physics, Materials Research Laboratory, The Pennsylvania State University, Aug. 15, 1997, vol. 82, No. 4, pp. 1804-1811.
Luo et al. "Crystallographic dependence of internal bias on domain engineered Mn-doped relaxor-PbTiO3 single crystals" Journal of Materials Chemistry C, Royal Society of Chemistry, 2016, vol. 4, pp. 4568-4576.
Sherrit et al. "High-Temperature Electromechanical Actuators" Chapter 10: High Temperature Materials and Mechanisms, Ed. Bar-Cohen, 2014, pp. 297-329, CRC Press Taylor & Francis Group.
First Office Action issued to Japanese counterpart Application No. 2020-512402 dated Jun. 23, 2022.

\* cited by examiner

POLAR NANOREGIONS ENGINEERED RELAXOR-PBTIO$_3$ FERROELECTRIC CRYSTALS

CROSS-REFERENCE TO RELATED APPLICATIONS

This application claims the benefit of, and priority to, U.S. Provisional Application No. 62/553,511, Polar Nanoregions Engineered Relaxor-PbTiO$_3$ Ferroelectric Crystals, which was filed on Sep. 1, 2017, and which is hereby incorporated by reference in its entirety.

FIELD

The present application is directed toward the field of piezoelectric crystals and methods for forming piezoelectric crystals, and more particularly to binary/ternary relaxor-PT based piezoelectric crystals and methods for forming binary/ternary relaxor-PT based piezoelectric crystals.

BACKGROUND

For the past 60 years, perovskite Pb(Zr$_x$Ti$_{1-x}$)O$_3$ ("PZT") ferroelectric ceramics have been the mainstay piezoelectric materials for commercial markets of electronic devices, such as piezoelectric sensors, actuators and medical ultrasonic transducers, owing to their high dielectric, piezoelectric, and electromechanical coupling factors. Specifically, the compositions in the vicinity of the morphotropic phase boundary ("MPB") in Pb(Zr$_x$Ti$_{1-x}$)O$_3$ (x=0.52), coexisting with the rhombohedral and tetragonal ferroelectric phases, exhibit anomalously high dielectric and piezoelectric properties as a result of enhanced polarizability arising from the coupling between two equivalent energy states, i.e., the tetragonal and rhombohedral phases, allowing optimum domain reorientation during poling. Numerous PZT formulations exist that have been engineered for specific characteristics that ultimately enhance their use in many applications. Table 1 lists the properties of exemplary commercially available soft PZT ceramics.

TABLE 1

Piezoelectric and dielectric properties of commercial PZT5 type ceramics.

| Ceramics | $d_{33}$ (pC/N) | $k_p$ | $\varepsilon_r$ | tan$\delta$ (%) |
|---|---|---|---|---|
| PZT5 | | | | |
| TRS200HD[1] | 400 | 0.66 | 2000 | 1.8 |
| 3195STD[2] | 350 | 0.63 | 1800 | 1.8 |
| 3295HD[2] | 390 | 0.65 | 1900 | 1.8 |
| PIC255[3] | 400 | 0.62 | 1750 | 2.0 |
| PIC155[3] | 360 | 0.62 | 1450 | 2.0 |
| PKI502[4] | 425 | 0.60 | 2000 | 1.5 |
| PZ23[5] | 328 | 0.52 | 1500 | 1.3 |
| PZ27[5] | 425 | 0.59 | 1800 | 1.7 |
| PZT5A1[6] | 410 | 0.62 | 1875 | 2.0 |
| PZT5A3[6] | 374 | 0.60 | 1700 | 2.0 |
| PZT5H | | | | |
| TRS610HD[1] | 690 | 0.70 | 3900 | 1.8 |
| CTS3203STD[2] | 550 | 0.69 | 3250 | 2.0 |
| CTS3203HD[2] | 650 | 0.70 | 3800 | 2.0 |
| PIC151[3] | 500 | 0.62 | 2400 | 2.0 |
| PIC153[3] | 600 | 0.62 | 4200 | 3.0 |
| PKI532[4] | 490 | 0.63 | 2700 | 2.0 |
| PKI552[4] | 600 | 0.67 | 3400 | 2.2 |
| PZ21[5] | 640 | 0.60 | 3980 | 1.6 |
| PZ29[5] | 570 | 0.64 | 2870 | 1.6 |
| PZT5H1[6] | 620 | 0.60 | 3400 | 1.8 |
| PZT5H2[6] | 590 | 0.65 | 3400 | 2.5 |

[1]TRS Technologies Inc.
[2]CTS Corporation
[3]PI Ceramic GmbH
[4]Piezo-kinetics Inc.
[5]Ferroperm
[6]Morgan Advanced Materials plc In the late 1950s, unusual dielectric behavior was reported in complex perovskites with the chemical formula of Pb(M$_I$, M$_{II}$)O$_3$, where M$_I$ is a low valence cation and M$_{II}$ is a high valence cation, generally referred to as a relaxor. Materials with this chemical structure exhibit frequency-dispersive dielectric permittivity, being related with the existence of polar nanoregions ("PNRs"). Of the many interesting relaxor materials discovered, lead magnesium niobate ("PMN") exhibited high dielectric permittivities and a strong nonhysteretic electrostrictive effect at room temperature. In the late 1970s, it was discovered that by creating a solid solution of PMN with the addition of the normal ferroelectric perovskite PbTiO$_3$ ("PT"), the Curie point and the nonhysteretic quadratic strain increased. This finding was quickly followed by the discovery that with increased compositional levels of PT, the electrostrictive behavior of PMN-PT was replaced by a more "classical" ferroelectric behavior, leading to the mapping of the PMN-PT binary phase diagram, which showed an MPB separating rhombohedral and tetragonal phases. Analogous to PZT, the piezoelectric properties of PMN-PT ceramics reach peak values at the MPB, being on the order of 700 pC/N. Of particular importance is that some of the relaxor-PT materials may be easily grown into single crystals, greatly enhance the piezoelectric and dielectric properties through the strong anisotropic characteristics and engineered domain configuration.

The excellent piezoelectric properties of Relaxor-PT single crystals, such as Pb(Mg$_{1/3}$Nb$_{2/3}$)O$_3$—PbTiO$_3$ ("PMN-PT") and Pb(In$_{1/2}$Nb$_{1/2}$)O$_3$—Pb(Mg$_{1/3}$Nb$_{2/3}$)O$_3$—PbTiO$_3$ ("PIN-PMN-PT"), have attracted considerable research interest in the last two decades. Specifically, single crystal compositions near the morphotropic phase boundary ("MPB") with [001] poled engineered domain configuration exhibit longitudinal piezoelectric coefficients (d$_{33}$) greater than 1500 pC/N with electromechanical coupling factors higher than 0.90 (see S. Zhang and F. Li, *High Performance Ferroelectric Relaxor-PT Single Crystals: Status and Perspective*, J. Appl. Phys. 111 (2012) 031301). For example, the typical crystal properties of two compositions are listed at the top in Table 2. All these excellent properties make relaxor-PT single crystals promising candidates for broadband and high sensitivity ultrasonic transducers, sensors and other electromechanical devices (see S. Zhang, F. Li, X. Jiang, J. Kim, J. Luo, X. Geng, *Advantages and Challenges of Relaxor-PT Ferroelectric Crystals for Electroacoustic Transducers—A Review*, Prog. Mater. Sci., 68 (2015) 1-66; S. Zhang, F. Li, J. Luo, R. Sahul, T. Shrout, *Relaxor-PT Single Crystals for Various Applications*, IEEE Trans. Ultrason., Ferro., Freq. Control, 60 (2013) 1572).

Innovations in piezoelectric devices have been the driving force for new developments in ferroelectric materials. In order to meet newly developed electromechanical devices, materials with higher dielectric and piezoelectric properties, when compared to legacy PZT and PMNT based materials, are desired. For example, piezoelectric sensors and actuators require higher piezoelectric coefficients $d_{33}>3,000$ pC/N, while medical imaging transducers are demanding high electromechanical coupling factors $k_{33}$ ($\geq 0.9$), since bandwidth and sensitivity of transducers are closely associated with the square of coupling factor. Of particular importance is that array transducers require high dielectric permittivity, meanwhile maintain the very high electromechanical couplings, due to the fact that the dielectric permittivity is inversely related to the electrical resistivity. In order to decrease the power dissipation and reduce the noise/crosstalk, transducer devices need high dielectric permittivity of the piezoelectric materials for electrical impedance matching, which is generally 50Ω as standard. Even the relaxor-PT crystals were reported to possess very high free dielectric permittivity >5,000, but the clamped dielectric permittivity is below 1,000, due to the high electromechanical coupling factor (see S. Zhang, F. Li, X. Jiang, J. Kim, J. Luo, X. Geng, *Advantages and Challenges of Relaxor-PT Ferroelectric Crystals for Electroacoustic Transducers—A Review*, Prog. Mater. Sci., 68 (2015) 1-66). Previous efforts have focused on the morphotropic phase boundary design, establishing rhombohedral to tetragonal compositional phase, and/or rhombohedral to orthorhombic/monoclinic to tetragonal phase boundaries, to enhance the piezoelectric and clamped dielectric properties, but only with limited success.

Recently, the contribution of polar nanoregions ("PNRs") in relaxor-based ferroelectrics has been theoretically modeled to be the origin of the ultrahigh dielectric and piezoelectric activities of relaxor based perovskite ferroelectrics, accounting for 50-80% of their respective room temperature values (F. Li et al., *The Origin of Ultrahigh Piezoelectricity in Relaxor-Ferroelectric Solid Solution Crystals*, Nature Communications, 7, 13807 (2016)). Analogous to PZT, relaxor-PT solid solutions were reported to possess good dielectric and piezoelectric properties, comparable to PZT, with MPB compositions, while the PNRs in the relaxor component also contribute to the high dielectric permittivity, which may be explained by the "collinear" state of the PNRs with the ferroelectric matrix. Thus, it would be desirable to control the size and volume of PNR, i.e., to control the local structure impact on the nearby lattice, to design new material systems with enhanced dielectric properties.

SUMMARY

Exemplary embodiments are directed to relaxor-PT based piezoelectric crystals and methods for forming the same.

In one exemplary embodiment, a relaxor-PT based piezoelectric crystal comprises the general formula of $(Pb_{1-1.5x}M_x)\{[(M_I,M_{II})_{1-z}(M_{I'},M_{II'})_z]_{1-y}Ti_y\}O_3$, wherein: M is a rare earth cation; $M_I$ is selected from the group consisting of $Mg^{2+}$, $Zn^{2+}$, $Yb^{3+}$, $Sc^{3+}$, and $In^{3+}$; $M_{II}$ is $Nb^{5+}$; $M_{I'}$ is selected from the group consisting of $Mg^{2+}$, $Zn^{2+}$, $Yb^{3+}$, $Sc^{3+}$, $In^{3+}$, and $Zr^{4+}$; $M_{II'}$ is $Nb^{5+}$ or $Zr^{4+}$; $0<x\leq 0.05$; $0.02<y<0.7$; and $0\leq z\leq 1$, provided that if either $M_{I'}$ or $M_{II'}$ is $Zr^{4+}$, both $M_{I'}$ and $M_{II'}$ are $Zr^{4+}$.

In another exemplary embodiment, a method for forming a relaxor-PT based piezoelectric crystal comprises presynthesizing precursor materials by calcining mixed oxides at a first calcination temperature, mixing the precursor materials with single oxides and calcining at a second calcination temperature lower than the first calcination temperature to form a feeding material having the general formula of $(Pb_{1-1.5x}M_x)\{[(M_I,M_{II})_{1-z}(M_{I'},M_{II'})_z]_{1-y}Ti_y\}O_3$, and growing the relaxor-PT based piezoelectric crystal having the general formula of $(Pb_{1-1.5x}M_x)\{[(M_I,M_{II})_{1-z}(M_{I'},M_{II'})_z]_{1-y}Ti_y\}O_3$ from the feeding material by a Bridgman method, wherein: M is a rare earth cation; $M_I$ is selected from the group consisting of $Mg^{2+}$, $Zn^{2+}$, $Yb^{3+}$, $Sc^{3+}$, and $In^{3+}$; $M_{II}$ is $Nb^{5+}$; $M_{I'}$ is selected from the group consisting of $Mg^{2+}$, $Zn^{2+}$, $Yb^{3+}$, $Sc^{3+}$, $In^{3+}$, and $Zr^{4+}$; $M_{II'}$ is $Nb^{5+}$ or $Zr^{4+}$; $0<x\leq 0.05$; $0.02<y<0.7$; and $0\leq z\leq 1$, provided that if either $M_{I'}$ or $M_{II'}$ is $Zr^{4+}$, both $M_{I'}$ and $M_{II'}$ are $Zr^{4+}$.

BRIEF DESCRIPTION OF THE DRAWINGS

Whenever possible, the same reference numbers will be used throughout the drawings to represent the same parts.

DETAILED DESCRIPTION OF EXEMPLARY EMBODIMENTS

Provided are piezoelectric crystals and methods for forming piezoelectric crystals. Embodiments of the present disclosure, in comparison to methods not including one or more of the features disclosed herein, include decreased variations of dielectric permittivity and piezoelectric coefficient along a rhombohedral phase section, increased piezoelectric coefficients, increased free dielectric permittivities, increased clamped dielectric permittivities, maintaining electromechanical coupling, or combinations thereof.

The present invention relates to piezoelectric crystals suitable for high performance electromechanical applications, such as actuators, piezoelectric sensors, and medical ultrasonic transducers. As ferroelectric crystals capable of attaining a large piezoelectric coefficient and dielectric permittivity, meanwhile maintaining the high electromechanical coupling being on the order of about 0.9, there have hitherto been known, for example, a binary or ternary system composed of lead titanate (PbTiO$_3$; PT) and relaxor end members, such as Pb(M$_I$,M$_{II}$)O$_3$, where M$_I$ may be Mg$^{2+}$, Zn$^{2+}$, Yb$^{3+}$, Sc$^{3+}$, or In$^{3+}$, while M$_{II}$ may be Nb$^{5+}$. Relaxor-PT single crystals have attracted extensive attentions in the last two decades for applications in high performance medical imaging transducers. However, because of the low clamped dielectric permittivity, such crystals have required more complicated designs for the electrical impedance matching.

The present disclosure relates to ferroelectric crystals based on relaxor-PT composition, characterized by high dielectric (both free and clamped dielectric permittivities) and electromechanical properties that may be adopted for different uses by modifying the PNRs volume ratio. The piezoelectric crystals based on the system Pb[(M$_I$,M$_{II}$)$_{1-z}$(M$_{I'}$,M$_{II'}$)$_z$]O$_3$-PT are modified in order to obtain a high level of dielectric/piezoelectric activity. The invention provides domain engineered piezoelectric crystals based on relaxor-PTs having the perovskite ABO$_3$ crystal structure, being furthermore substituted with heterovalent cations.

In this disclosure, the PNRs in relaxor-PT ferroelectric crystal systems were controlled by A-site modifications, demonstrating the impact of PNRs and/or local structure on the significantly improved dielectric and piezoelectric properties. A-site modified Pb[(M$_I$,M$_{II}$)$_{1-z}$(M$_{I'}$,M$_{II'}$)$_z$]O$_3$-PT binary/ternary crystals have been found to possess high dielectric and piezoelectric properties compared to those of unmodified counterparts, attributing to the local structure distortion and/or existence of controlled PNRs, and/or local structure with different phases from nearby matrix, where the free/clamped dielectric permittivity and piezoelectric coefficients are greatly increased, while maintaining the high electromechanical coupling factors.

Since Pb[(M$_I$,M$_{II}$)$_{1-z}$(M$_{I'}$,M$_{II'}$)$_z$]O$_3$-PT binary/ternary single crystals are complete solid solution systems as shown by high temperature phase diagrams, such crystals exhibit an inhomogeneous composition distribution along crystal boules grown by Bridgman method (Luo H, Xu G, Wang P, Yin Z, *Growth and Characterization of Relaxor Ferroelectric PMNT Single Crystals*, Ferroelectrics, 1999 231 685-690), resulting in the variation of dielectric and piezoelectric properties along the growth direction. However, as is presently disclosed, by A-site substitution with certain types of rare earth cations, the property variation along the crystal growth direction may be significantly reduced.

In one embodiment, a relaxor-PT based piezoelectric crystal comprises the general formula of (Pb$_{1-1.5x}$M$_x$){[(M$_I$,M$_{II}$)$_{1-z}$(M$_{I'}$,M$_{II'}$)$_z$]$_{1-y}$Ti$_y$}O$_3$, wherein: M is a rare earth cation; M$_I$ is Mg$^{2+}$, Zn$^{2+}$, Yb$^{3+}$, Sc$^{3+}$, In$^{3+}$, or any other suitable cation; M$_{II}$ is Nb$^{5+}$, or any other suitable cation; M$_{I'}$ is Mg$^{2+}$, Zn$^{2+}$, Yb$^{3+}$, Sc$^{3+}$, In$^{3+}$, Zr$^{4+}$, or any other suitable cation; M$_{II'}$ is Nb$^{5+}$, Zr$^{4+}$, or any other suitable cation; 0<x≤0.05; 0.02<y<0.7; and 0≤z≤1, provided that if either M$_{I'}$ or M$_{II'}$ is Zr$^{4+}$, both M$_{I'}$ and M$_{II'}$ are Zr$^{4+}$.

In one embodiment, wherein z is 0, the crystal is a binary crystal. The binary crystal may include M$_I$ being Mg$^{2+}$, Zn$^{2+}$, Yb$^{3+}$, Sc$^{3+}$, In$^{3+}$, or any other suitable cation, and M$_{II}$ being Nb$^{5+}$, or any other suitable cation.

In another embodiment, wherein z is greater than 0, the crystal is a ternary crystal. The ternary crystal may include M$_I$ being Mg$^{2+}$, Zn$^{2+}$, Yb$^{3+}$, Sc$^{3+}$, In$^{3+}$, or any other suitable cation, M$_{II}$ being Nb$^{5+}$, or any other suitable cation, and M$_{I'}$ and M$_{II'}$ each being Zr$^{4+}$, or any other suitable cation. Alternatively, the ternary crystal may include M$_I$ and M$_{I'}$ each being independently Mg$^{2+}$, Zn$^{2+}$, Yb$^{3+}$, Sc$^{3+}$, In$^{3+}$, or any other suitable cation and M$_{II}$ and M$_{II'}$ each being Nb$^{5+}$, or any other suitable cation.

M may be any suitable rare earth cation, including, but not limited to, La$^{3+}$, Ce$^{3+}$, Pr$^{3+}$, Nd$^{3+}$, Pm$^{3+}$, Sm$^{3+}$, Eu$^{3+}$, Gd$^{3+}$, Tb$^{3+}$, Dy$^{3+}$, Ho$^{3+}$, Er$^{3+}$, Tm$^{3+}$, Yb$^{3+}$, Lu$^{3+}$, or combinations thereof. In one embodiment, M is Sm$^{3+}$.

In one embodiment, the crystal is an M-modified Pb(Mg$_{1/3}$Nb$_{2/3}$)O$_3$—PbTiO$_3$ ("PMNT"). In another embodiment, the crystal is an M-modified Pb(In$_{1/2}$Nb$_{1/2}$)O$_3$—Pb(Mg$_{1/3}$Nb$_{2/3}$)O$_3$—PbTiO$_3$ ("PIN-PMN-PT"). Suitable compositions for the crystal include, but are not limited to, 1 mol % Sm: 26PIN-PMN-28PT, 1 mol % Sm: 26PIN-PMN-30PT, and 0.5 mol % Sm: 26PIN-PMN-30PT.

The crystal may include any suitable phase, including, but not limited to, rhombohedral, orthorhombic, tetragonal, and combinations thereof.

In one embodiment, the crystal exhibits less variation of dielectric permittivity and piezoelectric coefficient along a rhombohedral phase section relative to a comparative crystal having a comparative formula of Pb{[(M$_I$,M$_{II}$)$_{1-z}$(M$_{I'}$,M$_{II'}$)$_z$]$_{1-y}$Ti$_y$}O$_3$ with the same selections and values for y, z, M$_I$, M$_{II}$, M$_{I'}$, and M$_{II'}$ and the same crystal symmetry after poling. In a further embodiment, the crystal exhibits at least 25% less variations of dielectric permittivity and piezoelectric coefficient, alternatively at least 30% less, alternatively at least 35% less, alternatively at least 40% less.

In one embodiment, the crystal exhibits higher piezoelectric coefficient relative to a comparative crystal having a comparative formula of Pb {[(M$_I$,M$_{II}$)$_{1-z}$(M$_{I'}$,M$_{II'}$)$_z$]$_{1-y}$Ti$_y$}O$_3$ with the same selections and values for y, z, M$_I$, M$_{II}$, M$_{I'}$, and M$_{II'}$ and the same crystal symmetry after poling. In a further embodiment, the crystal exhibits at least 20% higher piezoelectric coefficient, alternatively at least 25% higher, alternatively at least 30% higher, alternatively at least 35% higher.

In one embodiment, the crystal exhibits higher free dielectric permittivity relative to a comparative crystal having a comparative formula of Pb {[(M$_I$,M$_{II}$)$_{1-z}$(M$_{I'}$,M$_{II'}$)$_z$]$_{1-y}$Ti$_y$}O$_3$ with the same selections and values for y, z, M$_I$, M$_{II}$, M$_{I'}$, and M$_{II'}$ and the same crystal symmetry after poling. In a further embodiment, the crystal exhibits at least 20% higher free dielectric permittivity, alternatively at least 25% higher, alternatively at least 30% higher, alternatively at least 35% higher.

In one embodiment, the crystal exhibits higher clamped dielectric permittivity relative to a comparative crystal having a comparative formula of Pb {[(M$_I$,M$_{II}$)$_{1-z}$(M$_{I'}$,M$_{II'}$)$_z$]$_{1-y}$Ti$_y$}O$_3$ with the same selections and values for y, z, M$_I$, M$_{II}$, M$_{I'}$, and M$_{II'}$ and the same crystal symmetry after poling. In a further embodiment, the crystal exhibits at least 20% higher clamped dielectric permittivity, alternatively at least 25% higher, alternatively at least 30% higher, alternatively at least 35% higher.

The crystal having the general formula of (Pb$_{1-1.5x}$M$_x$){[(M$_I$,M$_{II}$)$_{1-z}$(M$_{I'}$,M$_{II'}$)$_z$]$_{1-y}$Ti$_y$}O$_3$ may include any suitable value for x, including, but not limited to, 0<x≤0.05, alternatively 0.001≤x≤0.03, alternatively 0.0015≤x≤0.025.

The crystal having the general formula of (Pb$_{1-1.5x}$M$_x$){[(M$_I$,M$_{II}$)$_{1-z}$(M$_{I'}$,M$_{II'}$)$_z$]$_{1-y}$Ti$_y$}O$_3$ may include any suitable value for y, including, but not limited to, 0.02<y<0.7, alternatively 0.20≤y≤0.40, alternatively 0.25≤y≤0.35.

The crystal having the general formula of (Pb$_{1-1.5x}$M$_x$){[(M$_I$,M$_{II}$)$_{1-z}$(M$_{I'}$,M$_{II'}$)$_z$]$_{1-y}$Ti$_y$}O$_3$ may include any suitable value for z, including, but not limited to, 0≤z≤1, alternatively 0≤z≤0.40.

A-site modified relaxor-PT based piezoelectric crystals may be grown from their melt using the vertical Bridgman method or any other suitable method. The crystal may be grown along <001>, <110> or <111> orientations, or any suitable arbitrary orientation. The crystals may be poled in any suitable engineered domain configurations. For rhombohedral crystals, it may include [001] poled crystals with 4R engineered domain configuration and [011] poled crystals with 2R engineered domain configuration; for orthorhombic crystals, it may include [001] poled crystals with 4O engineered domain configuration, [111] poled crystals with 3O engineered domain configuration; and for tetragonal crystals, it may include [011] poled crystals with 2T engineered domain configurations [111] poled crystals with 3T engineered domain configuration.

In one embodiment, a vertical Bridgman method is applied to grow the crystals. To keep the crystal growth interface stable in the crystal growth process, at least 98%, alternatively pure, perovskite-phase raw materials may be pre-synthesized for preventing the pyrochlore phase formation during the raw material batching and spontaneous nucleation/polycrystalline grain growth in crystal growth. As used herein, "pure" indicates at least 99.5%. A precursor method may be adopted to a batching process to prevent the formation of a pyrochlore phase. For preparation, different precursor materials, such as, but not limited to, wolframite, $InNbO_4$, and columbite, $MgNb_2O_6$, may be synthesized first, respectively, by calcination of mixed oxides at 1,000-1,300° C. Following mixing single oxides, such as, but not limited to, $PbO/Pb_3O_4$, $TiO_2$, and rare-earth oxides with the precursor materials, feeding material having the general formula of $(Pb_{1-1.5x}M_x)\{[(M_I,M_{II})_{1-z}(M_{I'},M_{II'})_z]_{1-y}Ti_y\}O_3$ may be synthesized by another calcination process at lower temperature (700-950° C.), and powder x-ray diffraction (XRD) may be used to verify that sufficiently pure perovskite phase is obtained through this precursor method.

The crystals may then be grown from the feeding material having the general formula of $(Pb_{1-1.5x}M_x)\{[(M_I,M_{II})_{1-z}(M_{I'},M_{II'})_z]_{1-y}Ti_y\}O_3$ by the Bridgman method without crystal seeds or with crystal seeds of the same kind of crystals. A two heating-zone Bridgman furnace may be used for the crystal growth. The upper zone temperature may be higher than the melting point and lower zone temperature may be below the melting temperature, respectively, of the feeding material. In the Bridgman growth process, the cylindrical Pt crucibles charged with single crystal seeds (if applied) at the bottom and the feeding material in either powder or ceramic form above the seeds may be placed in the two-zone furnace. For growth of small crystals, multiple crucibles may be loaded into the furnace together in a single crystal growth run. By setting temperature of the upper zone 20-150° C. higher than the melting points and the lower zone 50-300° C. lower than the melting point, an axial temperature gradient of <50° C./cm may be formed between two zones. After the charge and part of the crystal seeds (if applied) are melted in the upper-zone, the crucibles may be lowered down slowly through the temperature gradient resulting in a unidirectional crystallization. By this method, crystals having the general formula of $(Pb_{1-1.5x}M_x)\{[(M_I,M_{II})_{1-z}(M_{I'},M_{II'})_z]_{1-y}Ti_y\}O_3$ with different diameter and length may be grown.

EXAMPLES

Figure 1:
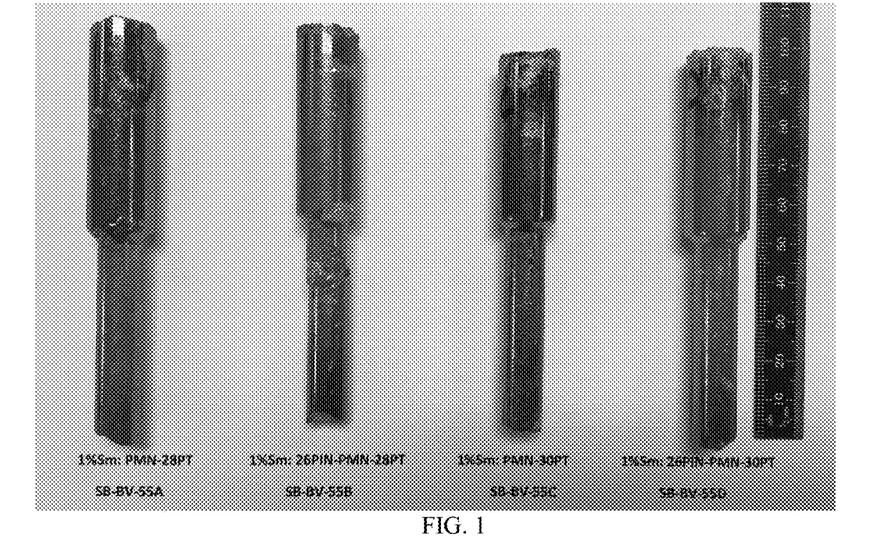
FIG. 1 shows Sm-modified PMN-PT and PIN-PMN-PT single crystals grown by the vertical Bridgman process, according to an embodiment of the present disclosure.

FIG. 1 shows Sm-modified PMN-PT and PIN-PMN-PT single crystals grown by the process described herein. The crystals were oriented using real-time Laue X-ray or an X-ray diffraction unit and then cut to obtain samples with the aspect ratios following IEEE piezoelectric standards (*IEEE Standard on Piezoelectricity*, ANSI/IEEE Standard, N Y, 1987-176). All the samples were oriented along <001>, <110> or <111> directions and gold was sputtered on the surfaces as the electrodes. Crystal samples were poled under 5-16 kV/cm at room temperature. High field polarization and strain measurements were performed at room temperature at low frequency using a modified Sawyer-Tower circuit and linear variable differential transducer (LVDT) driven by a lock-in amplifier. Room temperature dielectric, piezoelectric, electromechanical properties were determined according to IEEE standards, by using HP4194A Impedance-phase gain analyzer. The dielectric temperature dependence was measured in the frequency range of 0.1 kHz to 10 kHz using a multi-frequency LCR meter (HP4284A), connected to a computer-controlled temperature chamber. The test results of the <001>-poled, Sm-modified PMN-PT and PIN-PMN-PT crystals are summarized in Table 2 in comparison with the unmodified crystals. Some of the A-site modified PMN-PT and PIN-PMN-PT crystals, such as 1 mol % Sm: PMN-28PT, 1 mol % Sm: PMN-30PT, 1 mol % Sm: 26PIN-PMN-28PT, 1 mol % Sm: 26PIN-PMN-30PT and 0.5 mol % Sm: 26PIN-PMN-30PT, have significantly higher free and clamped dielectric permittivity ($\varepsilon_r$ and $\varepsilon_r$ clamped), piezoelectric coefficient ($d_{33}$) and coupling factor than the non-modified counterparts with compromises on rhombohedral-to-tetragonal phase transition temperature ($T_{rt}$) and dielectric loss (tan $\delta$). In order to take advantage of the impact of A-site substitution, the binary/ternary base composition and the substitution level may be optimized. It is seen that 2 mol % of A-site substitution by Sm in PMN-32PT and 26PIN-PMN-32PT shifted the majority of the as-grown crystal boules from rhombohedral phase to tetragonal phase, resulting in lower dielectric permittivity and piezoelectric coefficient. It is also seen that the crystal grown from 26PIN-PMN-28PT with 0.25 mol % Sm substitution on the A-site only possesses moderate dielectric and piezoelectric properties, due to the combination of low substitution level and low PT content. It should be noted that Table 2 only lists the feeding material composition of each crystal; however, each as-grown crystal covers a much broader range of compositions due to the compositional segregation effect, which will be described in further detail below.

TABLE 2

The properties of Sm: PMN-PT and Sm: PIN-PMN-PT crystals.

| Feeding Material | Phase | $d_{33}$ (pC/N) | tan$\delta$ (%) | $\varepsilon_r$ | $\varepsilon_r$ (clamped) | $k_{33}$ | v (m/s) | $T_{rt}$ (° C.) | $E_C$ (kV/cm) |
|---|---|---|---|---|---|---|---|---|---|
| PMN-30PT | R | 1150-2120 | <0.6 | 4100-5800 | 700-1000 | 0.89-0.93 | 4400-4600 | 88-96 | 2.0-3.0 |
| 26PIN-PMN-30PT | R | 1000-1800 | <0.6 | 3000-5000 | 600-900 | 0.88-0.93 | 4300-4550 | 110-130 | 4.5-6.0 |

TABLE 2-continued

The properties of Sm: PMN-PT and Sm: PIN-PMN-PT crystals.

| Feeding Material | Phase | $d_{33}$ (pC/N) | tan δ (%) | $\varepsilon_r$ | $\varepsilon_r$ (clamped) | $k_{33}$ | v (m/s) | $T_{rt}$ (° C.) | $E_C$ (kV/cm) |
|---|---|---|---|---|---|---|---|---|---|
| 1 mol % Sm: PMN-28PT | R | 2100-3200 | <1.2 | 6600-11000 | 1150-1700 | 0.89-0.94 | 4300-4550 | 59-75 | 2.0-3.0 |
| 1 mol % Sm: PMN-30PT | R | 2900-3600 | <1.5 | 7600-13000 | 1000-1300 | 0.91-0.94 | 4150-4600 | 47-60 | 2.0-3.0 |
| 2 mol % Sm: PMN-32PT | T | 740-1200 | 2 | 2200-12000 | / | 0.8-0.85 | / | ≤−50 | 2.0-2.6 |
| 1 mol % Sm: 26PIN-PMN-28PT | R | 1700-2600 | <1.2 | 5600-7000 | 1000-1300 | 0.89-0.95 | 4300-4500 | 65-87 | 3.5-6.0 |
| 1 mol % Sm: 26PIN-PMN-30PT | R | 2000-2500 | <1.6 | 5900-8200 | 900-1250 | 0.9-0.95 | 4300-4450 | 55-82 | 3.5-6.0 |
| 2 mol % Sm: 26PIN-PMN-32PT | T | 780-1100 | 2 | 2000-3200 | / | 0.8-0.87 | / | ≤20 | 5.6-6.0 |
| 0.5 mol % Sm: 26PIN-PMN-30PT | R | 1240-2680 | <1.2 | 4600-7800 | 740-940 | 0.89-0.95 | 4200-4400 | 86-94 | 4.7-6.1 |
| 0.25 mol % Sm: 26PIN-PMN-28PT | R | 1000-1500 | <0.7 | 3500-5100 | 580-810 | 0.88-0.94 | 4300-4500 | 98-116 | 5.0-6.0 |

*R: Rhombohedral; T: Tetragonal
* The samples were poled along <001>

Figure 2:
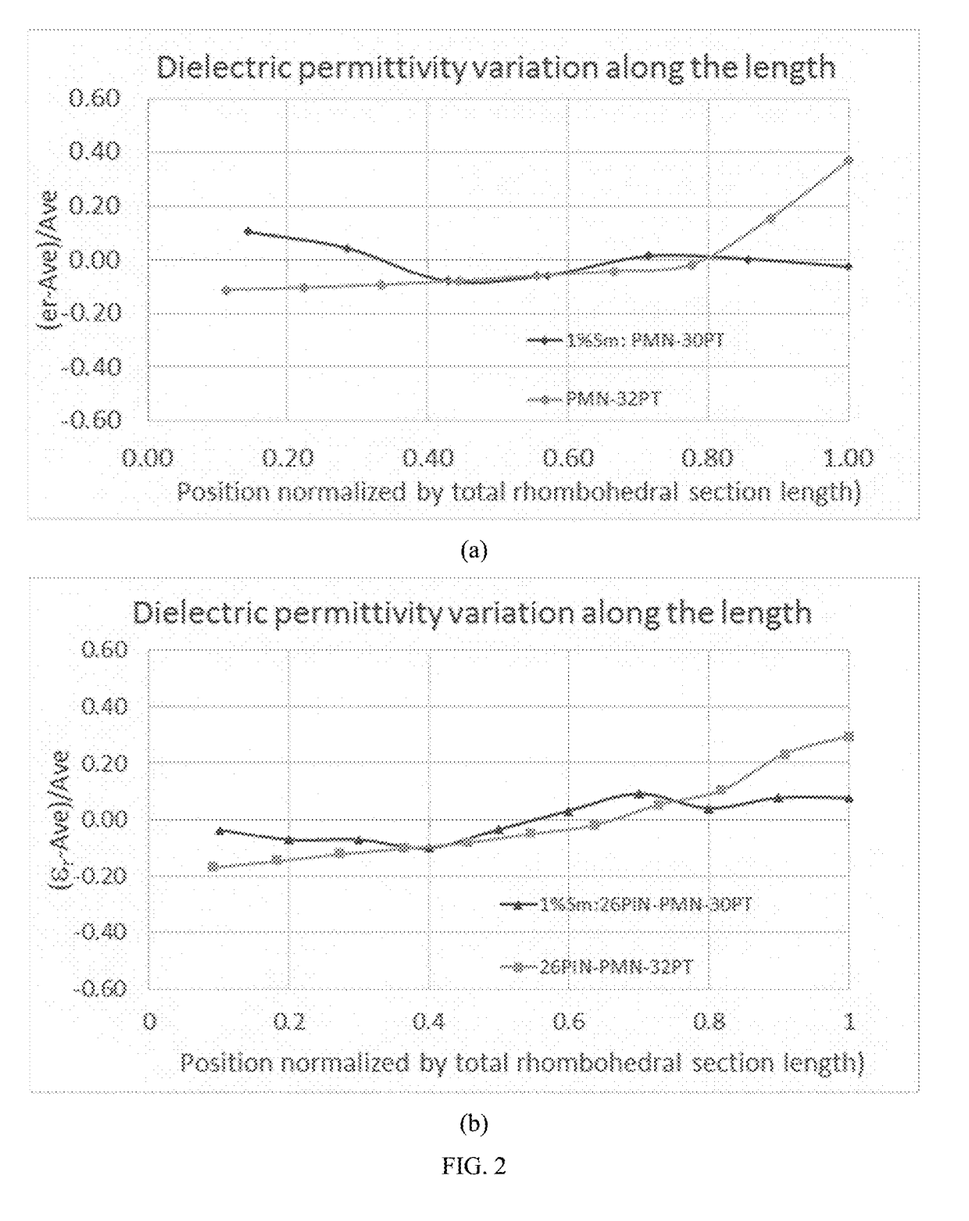
FIG. 2 shows variations of dielectric permittivity along the length of the unmodified and Sm-modified PMN-PT (a) and PIN-PMN-PT (b) crystals (only the rhombohedral phase section and poled along <001>), according to an embodiment of the present disclosure.
Figure 3:
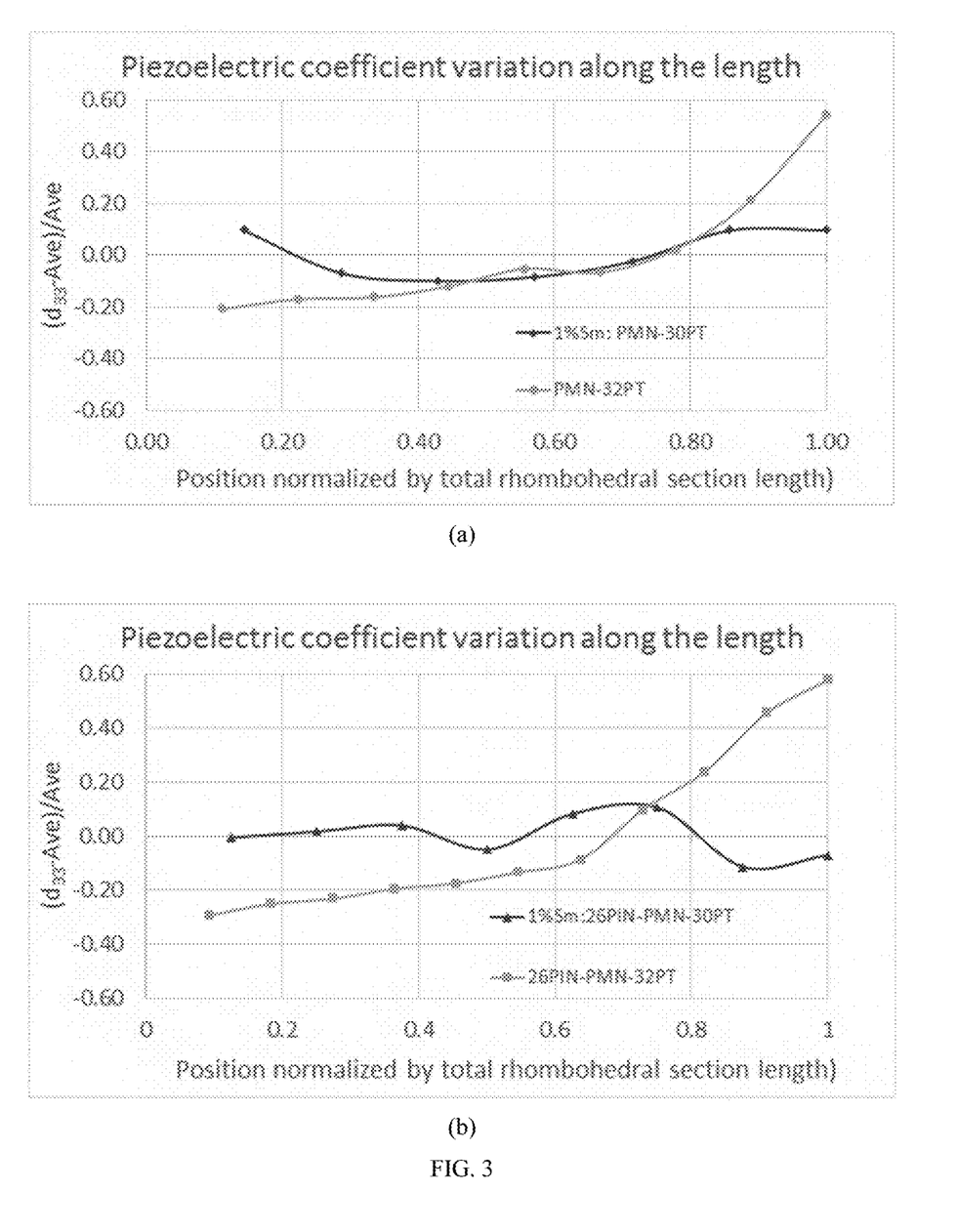
FIG. 3 shows variations of piezoelectric coefficient along the length of the unmodified and Sm-modified PMN-PT (a) and PIN-PMN-PT (b) crystals (only the rhombohedral phase section and poled along <001>), according to an embodiment of the present disclosure.

The longitudinal property variations in each crystal were characterized between the unmodified and A-site modified PMN-PT/PIN-PMN-PT crystals by measuring the <001>-poled samples taken from different positions along the length of each crystal. FIGS. 2 and 3 show the variations of dielectric permittivity and piezoelectric coefficient along the length of the unmodified and Sm-modified PMN-PT and PIN-PMN-PT crystals (only the rhombohedral phase section in each of the as-grown crystal). It is clearly seen that Sm may largely suppress the longitudinal property variations in the rhombohedral phase of PMN-PT and PIN-PMN-PT crystals. For example, FIG. 2 in (a) and (b) indicates that the dielectric permittivity totally varied over 45% in the rhombohedral section of a PMN-PT crystal and a PIN-PMN-PT crystal, but only about 19% in Sm-modified crystals of the same types. Similarly, as shown in FIG. 3 in (a) and (b), the piezoelectric coefficient totally varied over 75% in the rhombohedral section of a PMN-PT crystal and a PIN-PMN-PT crystal, but only about 22% in Sm-modified crystals of the same types. It is expected that Sm may reduce the variation of other properties in the crystal. In the same way, some of the other A-site substitutes may have the same impact on the crystals property variations as Sm.

The compositions of some of the as-grown crystals were analyzed by electronic probe microanalysis (EPMA). Due to the compositional segregation in these solid-solution systems, the bottom and top of each crystal boule present different concentrations for most of the main elements. As shown in the Table 3, except for Pb, all other elements in Sm:PMN-PT and Sm:PIN-PMN-PT crystals exhibit compositional segregation during Bridgman growth, exhibiting an effective segregation coefficient either larger than 1 (Nb, Mg, In and Sm) or smaller than 1 (Ti). For In, the composition segregation is quite close to 1 as its concentration is relatively consistent from the bottom to top of the crystal boules.

TABLE 3

Crystal composition determined by EPMA (at % normalized to Pb).

| Crystal ID | Sample location | Mg | Ti | Nb | Sm | In | Zr |
|---|---|---|---|---|---|---|---|
| BV-56B | Bottom | 17.16% | 25.80% | 49.86% | 0.31% | 13.33% | / |
|  | Top | 13.58% | 35.17% | 43.41% | 0.17% | 12.67% | / |
| BV-56C | Bottom | 16.80% | 28.50% | 47.66% | 0.62% | 13.15% | / |
|  | Top | 14.02% | 33.80% | 45.17% | 0.43% | 12.63% | / |
| BV-55A | Bottom | 24.61% | 29.64% | 51.14% | 0.89% | / | / |
|  | Top | 22.76% | 32.90% | 48.66% | 0.36% | / | / |
| BV-54D | Bottom | 15.80% | 29.56% | 46.25% | 2.67% | 13.16% | / |
|  | Middle | 15.37% | 31.08% | 45.64% | 2.45% | 13.21% | / |
| SB-BIII-16 | Bottom | 18.89% | 22.75% | 39.77% | / | / | 10.92% |
|  | Top | 18.89% | 34.58% | 37.06% | / | / | 0.33% |

Example 1

Sm:PMN-PT crystal growth: A typical Bridgman process for Sm-modified PMN-PT (2 mol % $Sm_2O_3$ in 68 mol % PMN-32 mol % PT) crystal growth is described as follows. According to the stoichiometry of the PMN-PT compound, PbO, $MgNb_2O_6$, and $TiO_2$ were mixed with 2 mol % $Sm_2O_3$. The mixture was milled by zirconia grinding media in a ball mill for 16 hours and then was dried in an oven around 50° C. The dried powder was sieved through an 80-mesh nylon screen, and then was calcined at 850° C. Purity of the perovskite phase was confirmed by XRD. The synthesized powder was pressed into small pellets, and then fired at 1250° C. The ceramic pellets were then charged into a tapered platinum (Pt) crucible. The Pt crucible is 15 mm in diameter and 100 mm long with a 10 mm in diameter and 50 mm long seed well (no single crystal seed was charged into the seed well).

Figure 4:
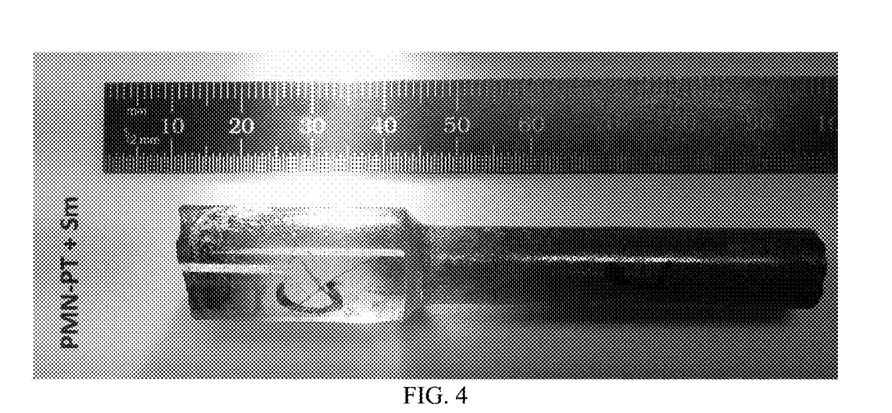
FIG. 4 shows the as-grow single crystal from a mixture of PMN-32PT and 2 mol % $Sm_2O_3$, according to an embodiment of the present disclosure.

A two heating-zone vertical Bridgman furnace was used for the crystal growth. The maximum temperatures for the upper and lower heating zones were 1390° C. and 1100° C., respectively. The vertical temperature gradient along the Pt crucible was >5° C./cm. After the whole charge was melted, it was soaked for 10 hours, and then the crucible was lowered down at a rate of 0.6 mm/hour to initiate the crystallization process at the bottom of the Pt crucible. After moving the crucible down about 150 mm, the crystallization process driven by the vertical temperature gradient was completed. Then the furnace was cooled down to room temperature in 78 hours. Yielded was a single crystal (except for the very beginning part of the boule) with a diameter of 10-15 mm and about 90 mm long and was grown roughly along the <111>-orientation. FIG. 4 is a photograph of this crystal boule.

Example 2

Sm:PIN-PMN-PT crystal growth: A typical Bridgman process for Sm-modified PIN-PMN-PT (2 mol % $Sm_2O_3$ in 26 mol % PIN-42 mol % PMN-32 mol % PT) crystal growth is described as follows. According to the stoichiometry of the PIN-PMN-PT compound, PbO, $MgNb_2O_6$, $InNbO_4$ and $TiO_2$ were mixed with 2 mol % $Sm_2O_3$. The mixture was milled by zirconia grinding media in a ball mill for 16 hours and then was dried in an oven around 50° C. The dried powder was sieved through an 80-mesh nylon screen, and then was calcined at 850° C. Purity of the perovskite phase was confirmed by XRD. The synthesized powder was pressed into small pellets, and then fired at 1250° C. The ceramic pellets were then charged into a tapered platinum (Pt) crucible. The Pt crucible is 15 mm in diameter and 100 mm long with a 10 mm in diameter and 50 mm long seed well (no single crystal seed was charged into the seed well).

Figure 5:
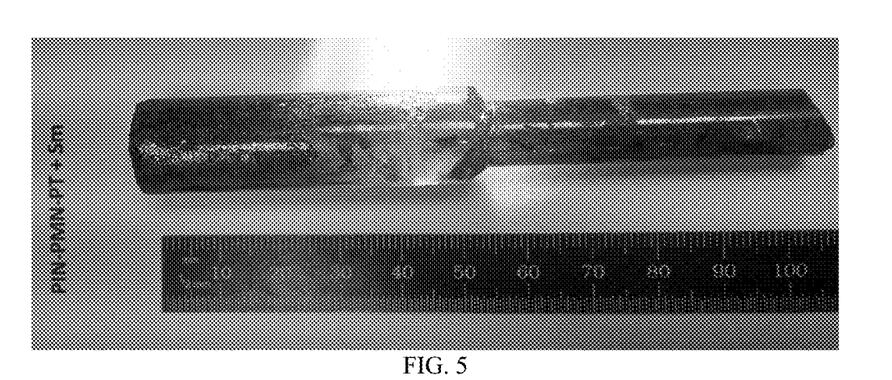
FIG. 5 shows the as-grow single crystal from a mixture of 26PIN-42PMN-32PT and 2 mol % $Sm_2O_3$, according to an embodiment of the present disclosure.

A two heating-zone vertical Bridgman furnace was used for the crystal growth. The maximum temperatures for the upper and lower heating zones were 1390° C. and 1100° C., respectively. The vertical temperature gradient along the Pt crucible was >5° C./cm. After the whole charge was melted, it was soaked for 10 hours, and then the crucible was lowered down at a rate of 0.6 mm/hour to initiate the crystallization process at the bottom of the Pt crucible. After moving the crucible down about 150 mm, the crystallization process driven by the vertical temperature gradient was completed. Then the furnace was cooled down to room temperature in 78 hours. Yielded was a single crystal (except for the very beginning part of the boule) with a diameter of 10-15 mm and about 110 mm long and was grown roughly along the <111>-orientation. FIG. 5 is a photograph of this crystal boule.

Example 3

Figure 6:
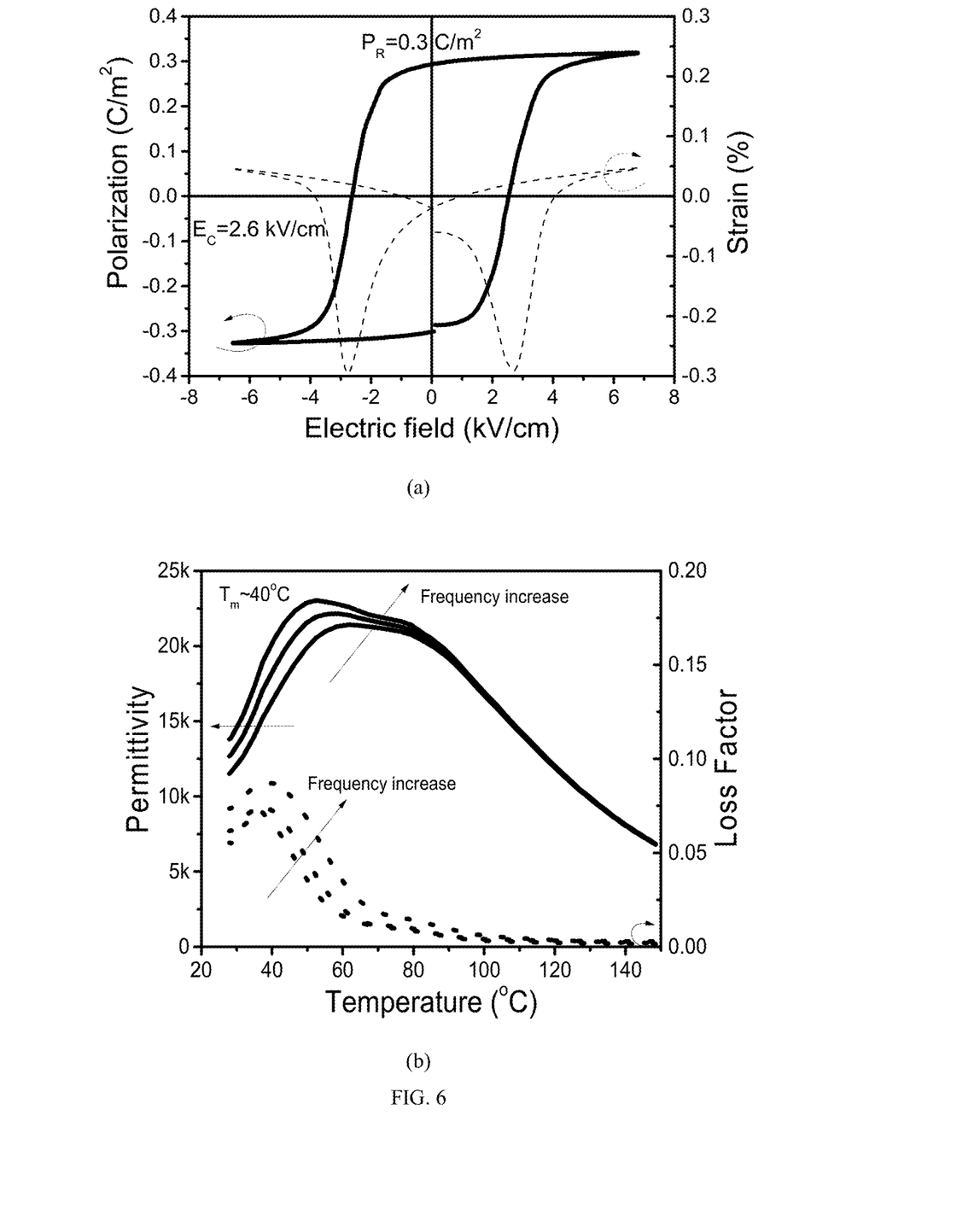
FIG. 6 shows (a) polarization and strain hysteresis loops under bipolar electric field, showing coercive field ($E_C$) and saturated polarization ($P_S$) (sample 1), and (b) dielectric permittivity variation with elevated temperature, showing the Curie temperature ($T_C$) (sample 2) in samples cut from the crystal growth from 2 mol % Sm: PMN-32PT mixture, according to an embodiment of the present disclosure.

Sm: PMN-PT crystal testing: Piezoelectric and dielectric properties of Sm-modified PMN-PT (2 mol % $Sm_2O_3$ in 68 mol % PMN-32 mol % PT) crystal grown in Experiment 1 have been measured. First, the single crystal boules were oriented by a real-time Laue X-ray photography system. Then thin plate samples with a width to thickness ratio of about 10:1 were cut from the boules with the pair of large faces of the plates in {001} family. After Au electrodes were sputtered onto the pair of large faces, the hysteresis cycles of the polarization and the strain were measured by using the Sawyer-Tower polarization and LVDT strain measurement system under a 10 kV/cm, 0.1-10 Hz AC field, from which the remnant polarization ($P_r$), coercive field ($E_C$) and piezoelectric coefficient ($d_{33}$) of the samples were obtained; meanwhile, the samples were poled along <001> (through the thickness). Dielectric permittivity and loss vs. temperature were measured within the temperature range 25-150° C. by a HP4174A LCR meter connected to a temperature chamber. The Curie temperature ($T_c$) & rhombohedral-to-tetragonal phase transition temperature ($T_{rt}$) were then determined by the maximum peaks of the dielectric permittivity. The measured dielectric and piezoelectric properties are shown in FIG. 6.

Example 4

Figure 7:
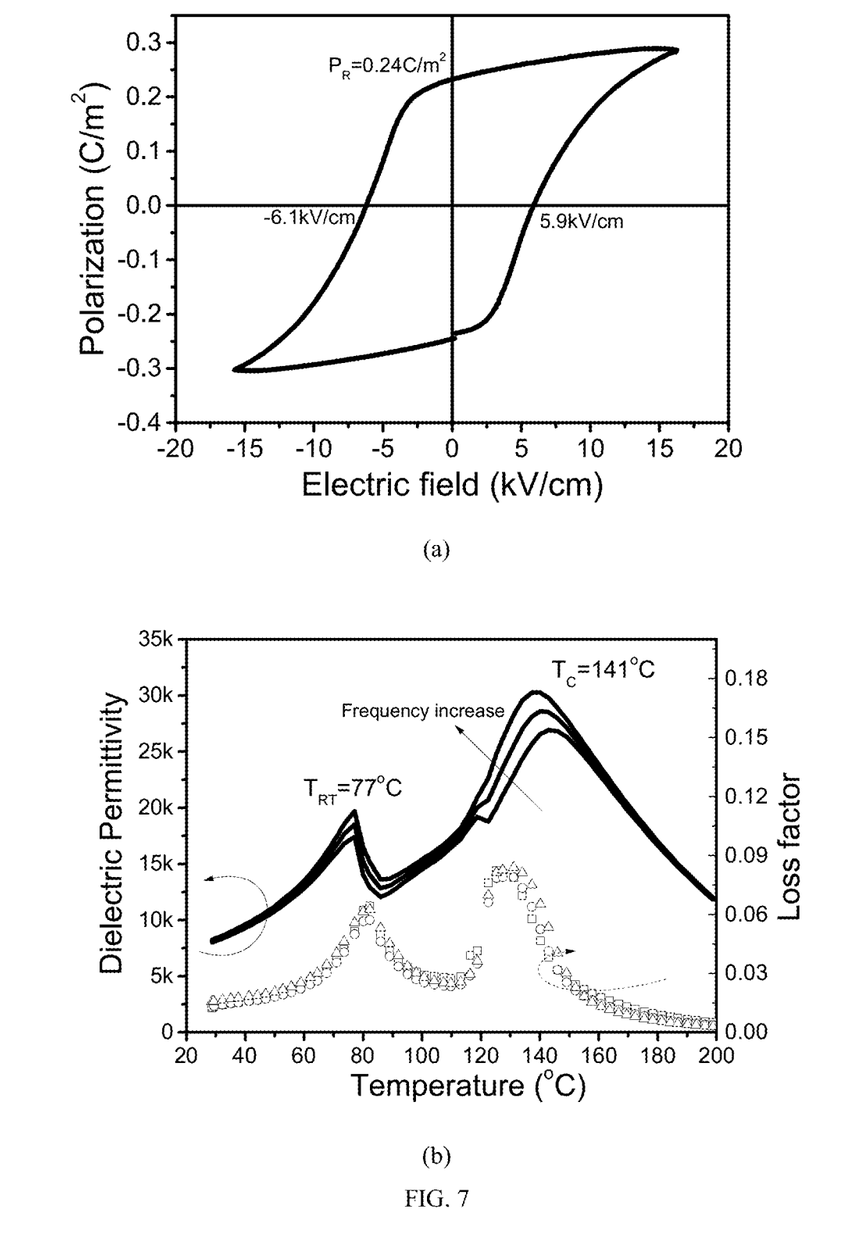
FIG. 7 shows the (a) polarization loops under bipolar electrical field and (b) dielectric permittivity and loss variation with elevated temperature in samples cut from the crystal growth from 1 mol % Sm: 26PIN-PMN-30PT mixture, according to an embodiment of the present disclosure.

Sm:PIN-PMN-PT crystal testing: Piezoelectric and dielectric properties of Sm-modified crystal grown from 26 mol % PIN-PMN-30 mol % PT (with 1 mol % $Sm_2O_3$ substitution) have been measured. First, the single crystal boules were oriented by a real-time Laue X-ray photography system. Then thin plate samples with a width to thickness ratio of about 10:1 were cut from the boules with the pair of large faces of the plates in {001} family. After Cr/Au electrodes were sputtered on the pair of large face, the hysteresis cycles of the polarization were measured by using the Sawyer-Tower polarization and LVDT strain measurement system under a 10 kV/cm, 0.1-10 Hz AC field, from which coercive field ($E_C$) and piezoelectric coefficient ($d_{33}$) of the samples were obtained; meanwhile, the samples were poled along <001> (through the thickness). Dielectric permittivity and loss vs. temperature were measured within the temperature range 25-200° C. by a HP4174A LCR meter connected to a temperature chamber. The Curie temperature ($T_c$) & rhombohedral-to-tetragonal phase transition temperature ($T_{rt}$) were then determined by the maximum peaks of the dielectric permittivity. The measured dielectric and piezoelectric properties are shown in Table 4. and FIG. 7.

TABLE 4

The properties of the <001>-poled samples from a Sm: PIN-PMN-PT crystal.

| Samples | $\varepsilon_r$ | tanδ (%) | $\varepsilon_r$ (clamped) | $d_{33}$ (pC/N) | $T_{rt}$ ($T_C$) (° C.) | $E_C$ (kV/cm) |
|---|---|---|---|---|---|---|
| D5-3 | 7640 | 0.7 | 1050 | 2150 | 77 (141) | 6.0 |
| D7-3 | 7230 | 1.2 | 900 | 2000 | 82 (143) | 5.6 |

Example 5

<111>-poled Sm-modified crystal testing: Piezoelectric and dielectric properties of Sm-modified crystal grown from PMN-32 mol % PT and 26 mol % PIN-PMN-32 mol % PT (both with 2 mol % $Sm_2O_3$ substitution) have been measured. First, the single crystal boules were oriented by a real-time Laue X-ray photography system. Then thin plate samples with a width to thickness ratio of about 10:1 were cut from the boules with the pair of large faces of the plates in {111} family. After Cr/Au electrodes were sputtered on the pair of large faces, the polarization and strain were measured by using the Sawyer-Tower polarization and LVDT strain measurement system under a 10 kV/cm, 0.1-10

Figure 8:
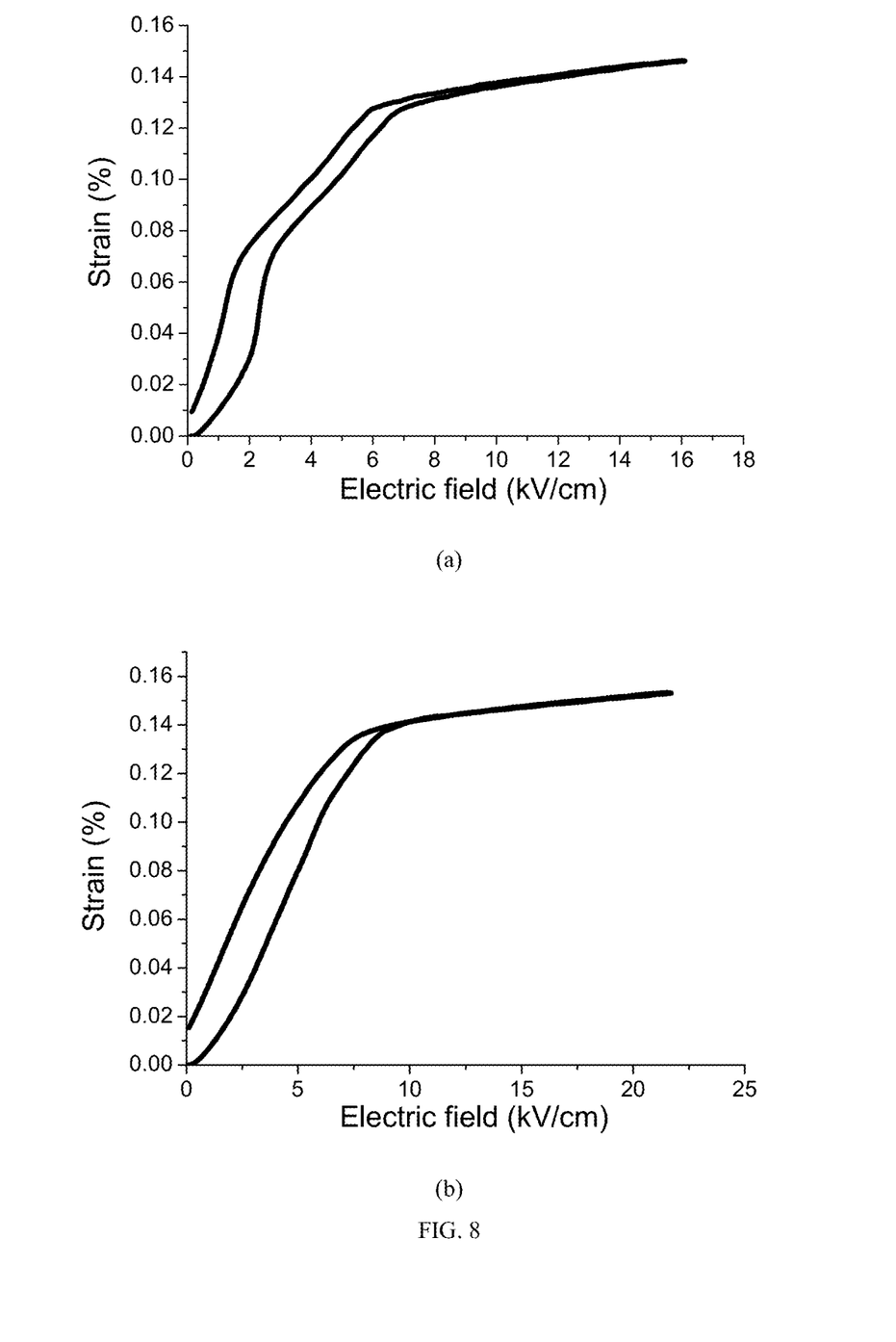
FIG. 8 shows the measured strain under unipolar electrical field of sample 1 (a) and sample 2 (b), according to an embodiment of the present disclosure.

Hz AC and DC fields, from which coercive field ($E_C$) and piezoelectric coefficient ($d_{33}$) of the samples were obtained; meanwhile, the samples were poled along <111> (through the thickness). Dielectric permittivity and loss vs. temperature were measured within the temperature range 25-200° C. by a HP4174A LCR meter connected to a temperature chamber. The Curie temperature ($T_c$) & rhombohedral-to-tetragonal phase transition temperature ($T_{rt}$) were then determined by the maximum peaks of the dielectric permittivity. The dielectric and piezoelectric properties measured at room temperature (except for $T_{rt}/T_C$) are shown in Table 5. and FIG. 8. At room temperature, Samples 1 and 2 may be in orthorhombic and tetragonal phases, respectively.

TABLE 5

The properties of the <111>-poled longitudinal mode samples from Sm-modified crystals.

| Sample | Sample from | $\varepsilon_r$ | tanδ (%) | $\varepsilon_r$ (clamped) | $d_{33}$ (pC/N) | $T_{rt}$ ($T_C$) (° C.) | $E_C$ (kV/cm) |
|---|---|---|---|---|---|---|---|
| 1 | 2 mol % Sm: PMN-32PT | 17000 | <2 | 5000 | 1400 | −30 (80) | 4.0 |
| 2 | 2 mol % Sm: 26PIN-PMN-32PT | 10500 | <2 | 3600 | 900 | −20 (135) | 7.7 |

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A relaxor-PT based piezoelectric crystal comprising the general formula of $(Pb_{1-1.5x}M_x)\{[(M_I,M_{II})_{1-z}(M_{I'},M_{II'})_z]_{1-y}Ti_y\}O_3$, wherein:
M is a rare earth cation selected from the group consisting of $Pm^{3+}$, $Sm^{3+}$, $Gd^{3+}$, and combinations thereof;
$M_I$ is selected from the group consisting of $Mg^{2+}$, $Zn^{2+}$, $Yb^{3+}$, $Sc^{3+}$, and $In^{3+}$;
$M_{II}$ is $Nb^{5+}$;
$M_{I'}$ is selected from the group consisting of $Mg^{2+}$, $Zn^{2+}$, $Yb^{3+}$, $Sc^{3+}$, $In^{3+}$, and $Zr^{4+}$;
$M_{II'}$ is $Nb^{5+}$ or $Zr^{4+}$;
0<x≤0.05;
0.02<y<0.7; and
0≤z<1,
provided that if either $M_{I'}$ or $M_{II'}$ is $Zr^{4+}$, both $M_{I'}$ and $M_{II'}$ are $Zr^{4+}$,
wherein the relaxor-PT based piezoelectric crystal is a single crystal boule, and
wherein the relaxor-PT based piezoelectric crystal, relative to a comparative crystal having a comparative formula of $Pb\{[(M_I,M_{II})_{1-z}(M_{I'},M_{II'})_z]_{1-y}Ti_y\}O_3$ with the same selections and values for y, z, $M_I$, $M_{II}$, $M_{I'}$, and $M_{II'}$ and the same crystal symmetry after poling, has at least one of:

less variation of dielectric permittivity and piezoelectric coefficient, along a rhombohedral phase section;
higher piezoelectric coefficient;
higher free dielectric permittivity;
higher clamped dielectric permittivity; or
combinations thereof.

2. The crystal of claim 1, wherein z is 0, and the crystal is a binary crystal.

3. The crystal of claim 2, wherein $M_I$ is selected from the group consisting of $Mg^{2+}$, $Zn^{2+}$, $Yb^{3+}$, $Sc^{3+}$, and $In^{3+}$, and $M_{II}$ is $Nb^{5+}$.

4. The crystal of claim 1, wherein 0<z<1, and the crystal is a ternary crystal.

5. The crystal of claim 4, wherein $M_I$ is selected from the group consisting of $Mg^{2+}$, $Zn^{2+}$, $Yb^{3+}$, $Sc^{3+}$, and $In^{3+}$, $M_{II}$ is $Nb^{5+}$, and $M_{I'}$ and $M_{II'}$ are each $Zr^{4+}$.

6. The crystal of claim 4, wherein $M_I$ and $M_{I'}$ are each independently selected from the group consisting of $Mg^{2+}$, $Zn^{2+}$, $Yb^{3+}$, $Sc^{3+}$, and $In^{3+}$, and $M_{II}$ and $M_{II'}$ are each $Nb^{5+}$.

7. The crystal of claim 1, wherein M is $Sm^{3+}$.

8. The crystal of claim 1, wherein the crystal is an M-modified $Pb(Mg_{1/3}Nb_{2/3})O_3$—$PbTiO_3$ ("PMNT").

9. The crystal of claim 1, wherein the crystal is an M-modified $Pb(In_{1/2}Nb_{1/2})O_3$—$Pb(Mg_{1/3}Nb_{2/3})O_3$—$PbTiO_3$ ("PIN-PMN-PT").

10. The crystal of claim 9, wherein the crystal is 1 mol % Sm: 26PIN-46PMN-28PT.

11. The crystal of claim 9, wherein the crystal is 1 mol % Sm: 26PIN-44PMN-30PT.

12. The crystal of claim 9, wherein the crystal is 0.5 mol % Sm: 26PIN-44PMN-30PT.

13. The crystal of claim 1, wherein the crystal includes a phase selected from the group consisting of rhombohedral, orthorhombic, tetragonal, and combinations thereof.

14. The crystal of claim 1, wherein the crystal exhibits at least 25% less variations of the dielectric permittivity and the piezoelectric coefficient along the rhombohedral phase section relative to the comparative crystal having the comparative formula of $Pb\{[(M_I,M_{II})_{1-z}(M_{I'},M_{II'})_z]_{1-y}Ti_y\}O_3$ with the same selections and values for y, z, $M_{II}$, $M_{I'}$, and $M_{II'}$ and the same crystal symmetry after poling.

15. The crystal of claim 1, wherein the crystal exhibits at least 20% higher of the piezoelectric coefficient relative to the comparative crystal having the comparative formula of $Pb\{[(M_I,M_{II})_{1-z}(M_{I'},M_{II'})_z]_{1-y}Ti_y\}O_3$ with the same selections and values for y, z, $M_I$, $M_{II}$, $M_{I'}$, and $M_{II'}$ and the same crystal symmetry after poling.

16. The crystal of claim 1, wherein the crystal exhibits at least 20% higher of the free dielectric permittivity relative to the comparative crystal having the comparative formula of $Pb\{[(M_I,M_{II})_{1-z}(M_{I'},M_{II'})_z]_{1-y}Ti_y\}O_3$ with the same selections and values for y, z, $M_I$, $M_{II}$, $M_{I'}$, and $M_{II'}$ and the same crystal symmetry after poling.

17. The crystal of claim 1, wherein the crystal exhibits at least 20% higher of the clamped dielectric permittivity relative to the comparative crystal having the comparative formula of $Pb\{[(M_I,M_{II})_{1-z}(M_{I'},M_{II'})_z]_{1-y}Ti_y\}O_3$ with the same selections and values for y, z, $M_I$, $M_{II}$, $M_{I'}$, and $M_{II'}$ and the same crystal symmetry after poling.

18. The crystal of claim 1, wherein $0.0015 \leq x \leq 0.025$.

19. The crystal of claim 1, wherein $0.25 \leq y \leq 0.35$.

20. The crystal of claim 1, wherein $0 \leq z \leq 0.40$.

21. A method for forming a relaxor-PT based piezoelectric crystal, comprising:

pre-synthesizing precursor materials by calcining mixed oxides at a first calcination temperature;

mixing the precursor materials with single oxides and calcining at a second calcination temperature lower than the first calcination temperature to form a feeding material having the general formula of $(Pb_{1-1.5x}M_x)\{[(M_I,M_{II})_{1-z}(M_{I'},M_{II'})_z]_{1-y}Ti_y\}O_3$; and growing the relaxor-PT based piezoelectric crystal having the general formula of $(Pb_{1-1.5x}M_x)\{[(M_I,M_{II})_{1-z}(M_{I'},M_{II'})_z]_{1-y}Ti_y\}O_3$ from the feeding material by a Bridgman method, wherein:

M is a rare earth cation selected from the group consisting of $Nd^{3+}$, $Pm^{3+}$, $Sm^{3+}$, $Gd^{3+}$, and combinations thereof;

$M_I$ is selected from the group consisting of $Mg^{2+}$, $Zn^{2+}$, $Yb^{3+}$, $Sc^{3+}$, and $In^{3+}$;

$M_{II}$ is $Nb^{5+}$;

$M_{I'}$ is selected from the group consisting of $Mg^{2+}$, $Yb^{2+}$, $Sc^{3+}$, $In^{3+}$, and $Zr^{4+}$;

$M_{II'}$ is $Nb^{5+}$ or $Zr^{4+}$;

$0<x\leq0.05$;

$0.02<y<0.7$; and $0\leq z<1$, provided that if either $M_{I'}$ or $M_{II'}$ is $Zr^{4+}$, both $M_{I'}$ and $M_{II'}$ are $Zr^{4+}$, and provided that if M is $Nd^{3+}$, $0<x<0.02$, wherein the relaxor-PT based piezoelectric crystal is a single crystal boule, and wherein the relaxor-PT based piezoelectric crystal, relative to a comparative crystal having a comparative formula of $Pb\{[(M_I,M_{II})_{1-z}(M_{I'},M_{II'})_z]_{1-y}Ti_y\}O_3$ with the same selections and values for y, z, $M_I$, $M_{II}$, $M_{I'}$, and $M_{II'}$ and the same crystal symmetry after poling, has at least one of:

less variation of dielectric permittivity and piezoelectric coefficient, along a rhombohedral phase section;

higher piezoelectric coefficient;

higher free dielectric permittivity;

higher clamped dielectric permittivity; or combinations thereof.

22. The method of claim 21, wherein the feeding material is at least 98% perovskite-phase.

23. The method of claim 21, wherein the feeding material is pure perovskite-phase.

24. The method of claim 21, wherein the precursor materials are selected from the group consisting of wolframite, $InNbO_4$, and columbite, $MgNb_2O_6$.

25. The method of claim 21, wherein the single oxides are selected from the group consisting of $PbO/Pb_3O_4$, $TiO_2$, and rare-earth oxides.

26. The method of claim 21, wherein the first calcination temperature with the range of 1,000-1,300° C.

27. The method of claim 21, wherein the second calcination temperature with the range of 700-950° C.

28. The method of claim 21, wherein the Bridgman method includes a two heating zone Bridgman furnace having an upper heating zone 20-150° C. higher than a melting point of the feeding material and a lower heating zone 50-300° C. lower than the melting point of the feeding material.

29. The method of claim 28, wherein the Bridgman furnace includes an axial temperature gradient of <50° C./cm between the upper heating zone and the lower heating zone.

30. A relaxor-PT based piezoelectric crystal comprising the general formula of $(Pb_{1-1.5x}M_x)\{[(M_I,M_{II})_{1-z}(M_{I'},M_{II'})_z]_{1-y}Ti_y\}O_3$, wherein:

M is a rare earth cation other than $La^{3+}$;

$M_I$ is selected from the group consisting of $Mg^{2+}$, $Zn^{2+}$, $Yb^{3+}$, $Sc^{3+}$, and $In^{3+}$;

$M_{II}$ is $Nb^{5+}$;

$M_{I'}$ is selected from the group consisting of $Mg^{2+}$, $Zn^{2+}$, $Yb^{3+}$, $Sc^{3+}$, $In^{3+}$, and $Zr^{4+}$;

$M_{II'}$ is $Nb^{5+}$ or $Zr^{4+}$;

$0<x\leq0.05$;

$0.02<y<0.7$; and $0\leq z<1$, provided that if either $M_{I'}$ or $M_{II'}$ is $Zr^{4+}$, both $M_{I'}$ and $M_{II'}$ are $Zr^{4+}$, provided that if M is $Nd^{3+}$, $0<x<0.02$, provided that if z is 0, M is selected from the group consisting of $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, and combinations thereof, and provided that if $0<z<1$, M is selected from the group consisting of $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Lu^{3+}$, and combinations thereof, and wherein the relaxor-PT based piezoelectric crystal is a single crystal boule.

31. The crystal of claim 9, wherein the crystal is 0.5 mol % Sm: 26PIN-43PMN-31PT.

32. The crystal of claim 1, wherein the single crystal boule of the relaxor-PT based piezoelectric crystal is a <001> poled rhombohedral crystal.

* * * * *